United States Patent
Benveniste

(10) Patent No.: US 6,833,710 B2
(45) Date of Patent: Dec. 21, 2004

(54) PROBE ASSEMBLY FOR DETECTING AN ION IN A PLASMA GENERATED IN AN ION SOURCE

(75) Inventor: Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 38 days.

(21) Appl. No.: 09/966,604

(22) Filed: Sep. 27, 2001

(65) Prior Publication Data

US 2002/0089332 A1 Jul. 11, 2002

Related U.S. Application Data

(60) Provisional application No. 60/243,690, filed on Oct. 27, 2000.

(51) Int. Cl.[7] .......................... G01N 27/62; G01K 1/08
(52) U.S. Cl. ............................ 324/466; 250/423 R
(58) Field of Search ...................... 324/466; 250/309, 250/398, 492.21, 489, 287, 423 R, 424, 426, 397; 378/137, 156

(56) References Cited

U.S. PATENT DOCUMENTS

| | | | | |
|---|---|---|---|---|
| 4,691,662 A | * | 9/1987 | Roppel et al. | 118/50.1 |
| 4,714,891 A | * | 12/1987 | Morrison, Jr. | 324/459 |
| 4,789,787 A | * | 12/1988 | Parker | 250/396 ML |
| 5,113,072 A | * | 5/1992 | Yamaguchi et al. | 250/309 |
| 6,208,711 B1 | * | 3/2001 | Rand et al. | 378/138 |
| 6,504,159 B1 | * | 1/2003 | Keller | 250/423 |

* cited by examiner

Primary Examiner—Anjan Deb
Assistant Examiner—Amy He
(74) Attorney, Agent, or Firm—Lahive & Cockfield, LLP

(57) ABSTRACT

A method and apparatus relating to an ion implantation system that employs an ion source for generating a plasma having an ion, and a probe assembly for detecting the ion of the plasma is provided. The probe assembly includes a probe body and a focusing device for extracting the ion from the plasma, and a filter for filtering ions extracted from the plasma.

14 Claims, 4 Drawing Sheets

PROBE ASSEMBLY FOR DETECTING AN ION IN A PLASMA GENERATED IN AN ION SOURCE

RELATED APPLICATION

This application claims priority to co-pending U.S. Provisional Application No. 60/243,690, filed Oct. 27, 2000, for all subject matter common to both applications. The disclosure of said provisional application is hereby incorporated herein by reference in its entirety.

FIELD OF THE INVENTION

The present invention relates to ion sources and semiconductor fabrication processes, and more particularly relates to a detection system for detecting a parameter of the ion source.

BACKGROUND OF THE INVENTION

Today, semiconductor fabrication processes are utilized to generate various silicon based devices. In a conventional semiconductor fabrication system, an ion source generates a plasma, from which an ion beam is extracted to implant a substrate, such as a semiconductor wafer. During the development of an ion source, it is desirable to evaluate plasma parameters. For example, it is known that plasmas generated in semiconductor fabrication systems are generally non-homogeneous. Therefore, particular plasma properties such as plasma density and electron temperature are detected and mapped using conventional devices, such as a langmuir probe.

A drawback of this conventional detection scheme is that it cannot provide the ion composition and charged state distribution of the plasma.

Hence, there still exists a need in the art for a detection system suitable for use with an ion source of an ion implantation system capable of mapping these parameters within the ion source.

The invention will next be described in connection with certain preferred embodiments. However, it should be clear that various changes and modifications can be made by those skilled in the art without departing from the spirit and scope of the invention. For example, various detection systems employing various system components suitable for detecting an ion source parameter can be employed.

SUMMARY

There is a need for a probe assembly for detecting the ion composition of a plasma generated within an ion implantation system. The present invention is directed toward further solutions to address this need.

The present invention provides for an ion implantation system that employs an ion source for generating a plasma, and a probe assembly for detecting the ions at a local point of the plasma. The probe assembly includes a probe body and a focusing device or element for extracting the ion from the plasma, and a filter for filtering ions extracted from the plasma. As used herein, the term ion is intended to include any suitable ion and ion species created within the plasma chamber of an ion source.

Other general and more specific objects of the invention will in part be obvious and will in part be evident from the drawings and description which follow.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

DETAILED DESCRIPTION

The present invention provides for an ion implantation system that employs a probe assembly for detecting, sensing, identifying or determining the presence or absence of one or more ions in a plasma generated in a plasma chamber of an ion source. The probe assembly comprises a probe device or element that extends within the plasma chamber of the ion source through an appropriate aperture in a wall of the source, and extracts ions therefrom. The ions are then transferred to a filter, where they are filtered according to velocity, and then analyzed by the probe assembly. Hence, the probe assembly can determine the spectral content or ion composition of the plasma within the plasma chamber.

Figure 1:
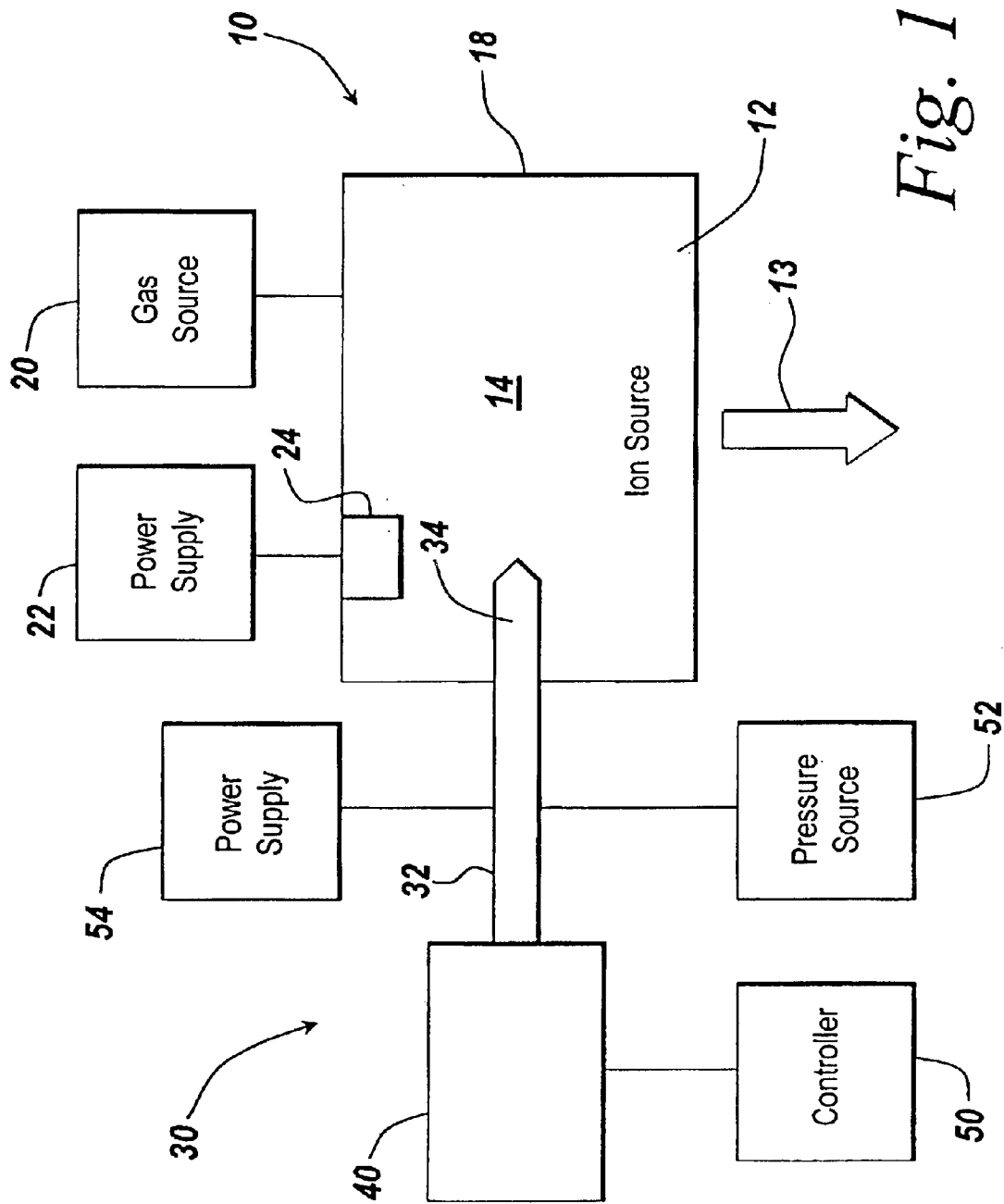
FIG. 1 is a schematic block diagrammatical depiction of an ion source that employs a probe assembly for detecting an ion in a plasma according to the teachings of the present invention.

FIG. 1 illustrates in block diagram form an ion implantation system 10 that includes an ion source 12 for generating and emitting a beam that impinges upon the workpiece mounted within a process chamber (not shown).

The illustrated ion source 12 can include standard components, and in particular includes a standard housing 18 that forms a plasma chamber 14. The plasma chamber can take the form of a parallelepiped, or can be bucket shaped. The chamber 14 can include an inlet aperture for introducing a gas from a gas source 20 to be ionized into a plasma, and an exit aperture (not shown) through which the plasma is extracted to form the beam 13. The plasma chamber 14 can be coupled to the gas source 20 via any suitable fluid network. The plasma comprises one or more desirable or undesirable ions, as well as electrons of varying energies.

The ion source 12 can further include an exciter 24 (e.g., an energizing electrode) that is coupled to a power source 22 via any suitable electrical connection. The exciter 24 ionizes the discharged gas to initiate the creation of a plasma within the ion source 12. For example, a selected dopant gas, such as boron trifluoride or phosphorous pentafluoride, is housed within the gas source. This gas is introduced to the plasma chamber 14, and is ionized by the exciter to form a plasma. The exciter 24 can be formed of a biased tungsten filament, which when heated to a suitable temperature, thermionically emits electrons. The emitted electrons generated by the exciter interact with and ionize the released gas to form a plasma within the plasma chamber. The exciter can also introduce other energy sources, such as an RF focusing device or element that ionizes the electrons by emitting a radio frequency signal. For example, the energizing electrode 20 is energized by the power source 22 upon actuation. The foregoing structure of the ion source, electrode, power source and fluid networks are known in the art, are commercially available, and their connections and operation will be apparent to those of ordinary skill in the art.

The ion source 12 can further include magnets mounted about the exterior walls of the ion source to urge the plasma towards a center of the plasma chamber 14 by forming a multi-cusp field therein. The ion source 12 can also include a plasma electrode (not shown) at an end opposite the exciter 24 for allowing the beam 13 to exit the source. An extraction electrode can be located outside the plasma chamber to extract the plasma through the plasma electrode opening, as is known in the art. The extracted plasma forms the beam 13, which is directed towards the workpiece.

The illustrated ion source 12 further includes a probe assembly 30 that can include a probe device 32 that has a distal end 34 mounted within the plasma chamber 14, and a proximal end coupled to a filter 40. The probe 32 can include electrodes for producing a field within the probe to extract an ion from the plasma chamber 14. The probe assembly can comprise any suitable number and arrangement of components, including a subset of the components illustrated in FIG. 1 or additional components, and generally is adapted to extract an ion from the ion chamber to sense, detect, or determine the spectral content or ion composition of the plasma.

A power supply 54 can be coupled to the probe device 32 to bias the probe at a selected potential. According to one practice, the power supply 54 establishes a potential across the probe by applying any suitable voltage thereto, such as a voltage of −500V. The probe device 32 can also be coupled to a vacuum source 52 for reducing the pressure within the probe device. According to one practice, the vacuum source 52 is a vacuum pump that creates a pressure of about $10^{-5}$ Torr within the probe. The field generated within the probe 32 extract ions from the plasma chamber 14.

The extracted ions are then introduced to the filter 40. The filter 40 filters the ions based on a selected parameter, such as ion velocity or mass. The filter 40 can be any selected filter suitable for filtering ions based on one or more ion parameters, examples of which are a Wien filter or an EXB filter.

A controller 50 is coupled to the filter 40 for assisting the generation of a field within the filter to sweep the ions when passing therethrough. The controller 50 can further determine, sense or detect the presence or absence of a particular ion or ion specie within the plasma. The controller preferably includes structure for applying a potential to the filter 40 to filter the ions passing therethrough and for determining, sensing, detecting or identifying the presence or absence of a particular ion. For purposes of clarity, we will refer to the controller 50 as detecting ions, although one or more of the foregoing functions is intended to be included when this form is used. The controller can hence include any appropriate power source and a computing apparatus. The phrase "computing apparatus" as used herein refers to a programmable or non-programmable device that responds to a specific set of instructions or executes a set of instructions.

Figure 2:
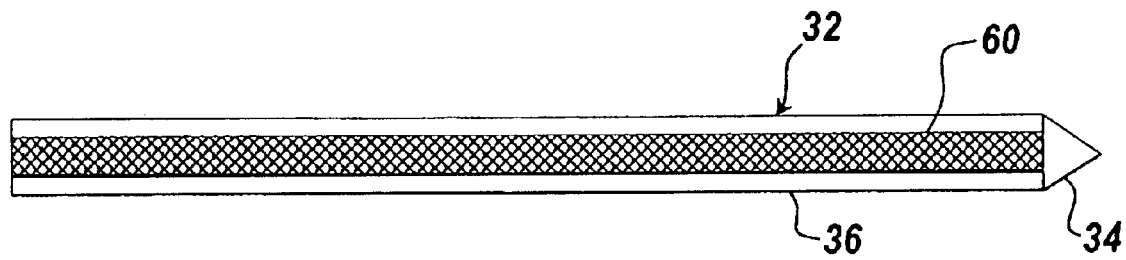
FIG. 2 is a schematic depiction of a probe device suitable for extracting an ion from the plasma chamber of the ion source.

FIG. 2 is a schematic representation of the probe device 32 of the probe assembly 30 of FIG. 1. The illustrated probe device 32 includes an elongate probe body 36 that terminates in a conical distal end or tip 34. The illustrated probe body device 36 has an internal passageway 38 that extends between the opposed ends of the probe device 32. The illustrated passageway 38 is preferably sized and dimensioned for allowing one or more ions present in the plasma within the plasma chamber 14 to pass therethrough. The passageway 38, in accordance with one embodiment, is approximately 6 mm internal diameter, and 25 cm in length. The illustrated probe 32 further includes a set of electrodes that, when properly energized, produce an electric field distribution that confines the extracted ions within the passageway 38. In particular, the twisting set of eight electrodes produces a rotating quadrupole field that alternately focuses the ions in all directions.

Figure 3:
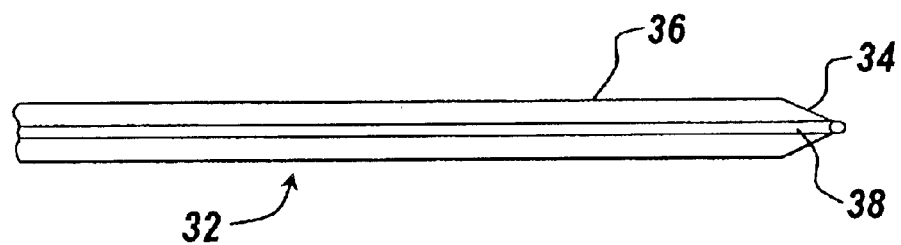
FIG. 3 is a schematic depiction of the probe body of the probe device of FIG. 2 according to the teachings of the present invention.
Figure 4:
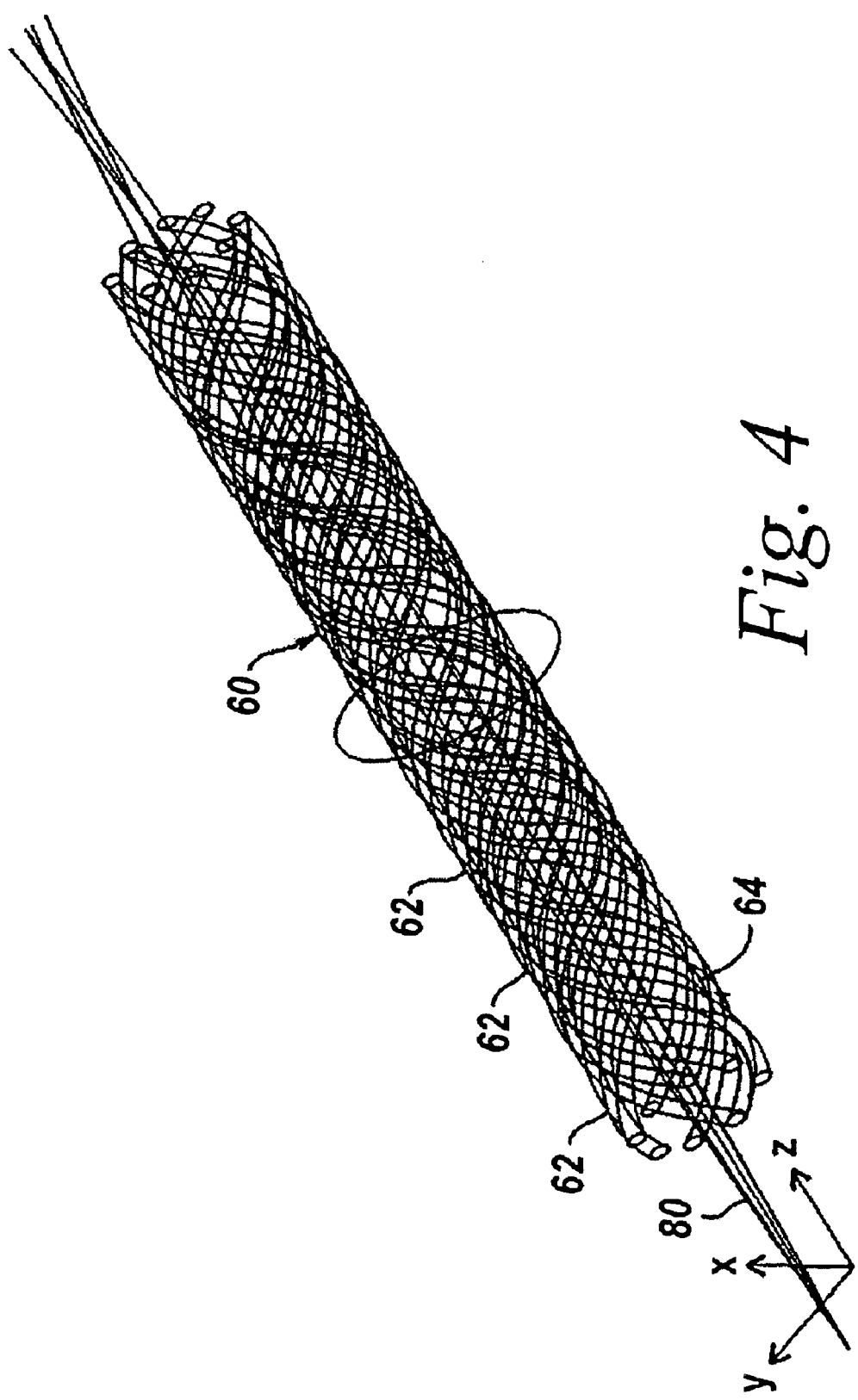
FIG. 4 is a perspective view of the electrodes when wrapped inside the probe device of FIG. 3.

FIGS. 3 and 4 illustrate the parts and assemblage of the probe device 32 of the present invention. The illustrated focusing device 60, or focusing element, can be formed by creating multiple parallel conductive strips 62, or electrodes, on a support 64. According to one practice, the illustrated conductive strip 62 can be formed of copper, and the support 64 can be formed of aluminum, Mylar®, made by E.I. Du Pont De Nemours and Company of Wilmington, Del., or any other thin insulating layer. Those of ordinary skill will readily recognize that any suitable number of conductive strips can be placed on the support 64 to form the focusing device 60 of the present invention. In particular, the focusing device preferably includes four or more conductive strips, and preferably includes eight conductive strips as shown. The probe device 32 can be formed by wrapping the focusing device element 60 inside the probe body 36 of FIG. 3 such that the illustrated conductive strips 62 spiral inside the probe body 36. The conductive strips 62 of the focusing device 60, when wound inside the probe body 36 have an overlapping, interlocking arrangement, as illustrated in FIG. 4, to convey ions 80 through the probe body 36. According to the present embodiment, when the focusing device element 60 is energized by the power supply 54, or by any other suitable power source, the focusing device 60 creates a suitable electromagnetic field within the probe body 36, and preferably within the passageway 38. The conical tip end 34, in conjunction with the electrode bias, generates a suitable electric field to extract the ions from the plasma. The ions are then transferred to the filter.

Figure 5:
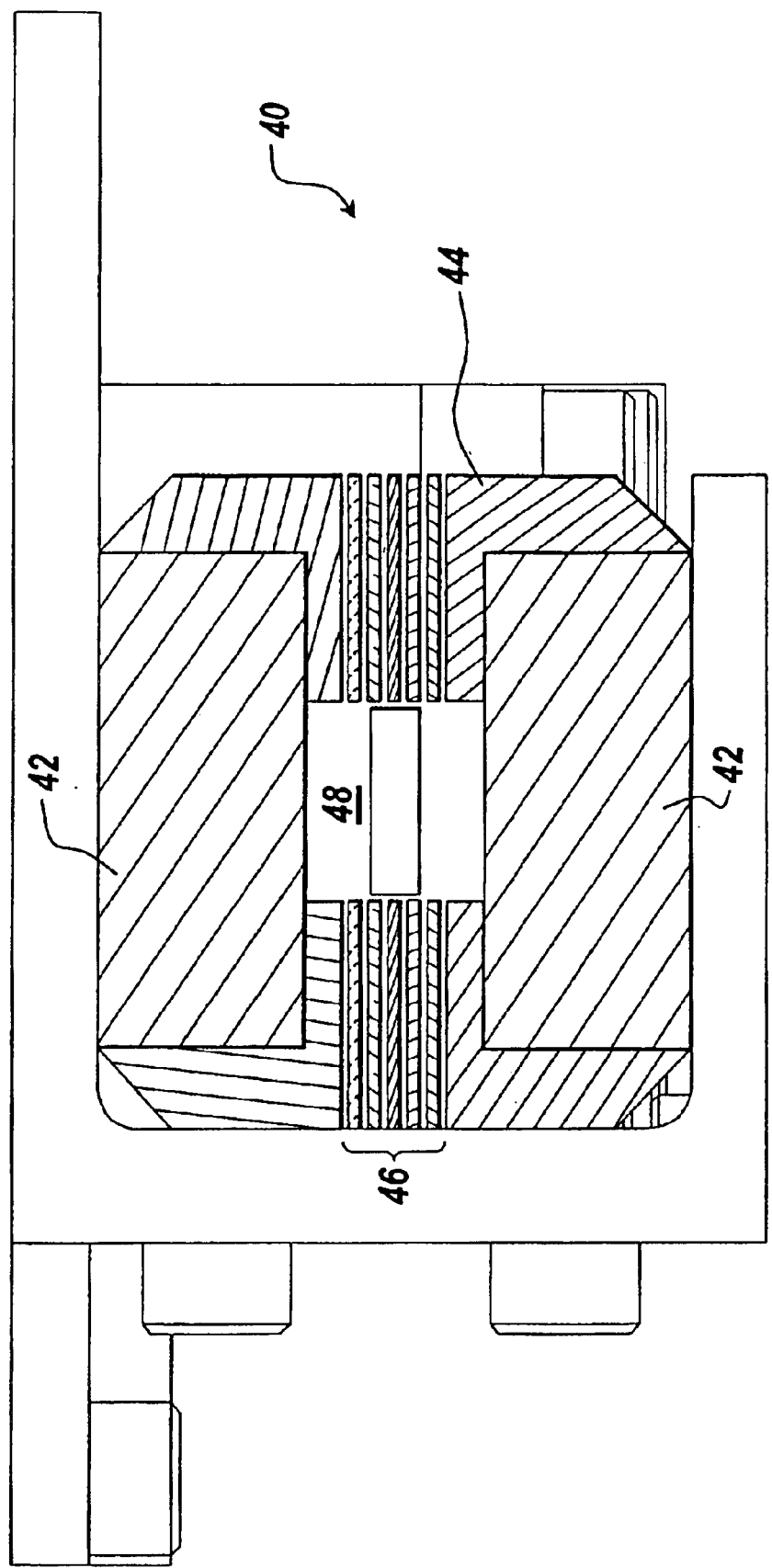
FIG. 5 is a segmented, cross-sectional view of the filter of the probe assembly of FIG. 1.

FIG. 5 is a segmented, cross-sectional depiction of the filter 40 of FIG. 1. The filter 40 includes a series of magnets 42 that are seated within a support element 44. The illustrated support can be composed of any suitable material compatible with the magnets 42, and is preferably composed of steel. The illustrated element support 44 functions to concentrate the magnetic field generated by the magnets 42 within an inner portion 48 of the filter.

The illustrated filter 40 further includes a plurality of steel strips 46 that are mounted within the support element 44 for further concentrating the magnetic field within the filter inner portion. The inner portion can be constructed as a passageway that extends through the filter and which is surrounded by the magnets 42. The steel strips are isolated from each other and the magnets, such that the steel strips can be biased at different voltages to produce a potential gradient, or uniform electric field, within the passageway. Those of ordinary skill will readily recognize that the illustrated filter 40 when energized by the controller 50 can filter or separate incoming ions according to one or more parameters, such as velocity or mass. The controller 50 then detects, senses or identifies the particular ions according to the foregoing parameters. For example, the magnets 42,42 are energized and a potential difference is established therebetween as the ions are passing through the filter 40. When separating by ion velocity, those of ordinary skill will recognize that the ion velocity is proportional to the applied electric or magnetic field. Consequently, the electric field generated within the filter 40 can be varied, regulated, or controlled by the controller 50 in order to select a particular ion according to velocity.

A significant advantage of the probe device 32 is that a portion can be placed directly within the plasma chamber 14 to extract ions therefrom. The probe assembly 30 further includes the advantage of filtering the ions extracted from the plasma chamber to determine the spectral content or ion composition of the plasma, or to identify particular ions.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by Letters Patent is:

1. A system for determining the presence or absence of an ion in a plasma, comprising:
   an ion source having a plasma chamber sized and dimensioned for generating a plasma having an ion present therein, and
   a probe assembly coupled to the ion source for detecting said ions of said plasma, the probe assembly having a probe device adapted for extending at least partly within the plasma chamber for extracting one or more of said ions from said plasma and a filter coupled to said probe device for filtering said one or more ions extracted by said probe device from said plasma.

2. The system of claim 1, wherein the probe device comprises:
   a probe body having a conical tip disposed within the plasma chamber, and
   a focusing element mounted to said probe body and adapted for generating a field, when energized, therein.

3. The system of claim 1, wherein the filter comprises at least one of a Wien filter and an EXB filter.

4. The system of claim 1, wherein the filter comprises a plurality of steel strips for concentrating a magnetic field within the filter.

5. The system of claim 4, wherein the plurality of steel strips are biased at different voltages to produce one of a potential gradient and a uniform electric field within a passageway.

6. The system of claim 1, further comprising means for generating an electric field within the filter to separate one or more ions based on ion velocity.

7. The system of claim 1, further comprising a vacuum source coupled to said probe device for creating a selected pressure condition therein for facilitating extraction of said ion from said plasma chamber.

8. The system of claim 1, wherein said probe assembly comprises a probe device having a probe body, a portion of which is adapted to extend into said plasma chamber, and a set of electrodes coupled to said probe body for creating a field therein.

9. The system of claim 1, wherein said probe assembly comprises a probe device for extracting one or more ions from said plasma, a filter for filtering said ions, and a controller for detecting said one or more ions.

10. A probe assembly suitable for use with an ion source for detecting an ion in a plasma within a plasma chamber of the ion source, comprising:
    a probe body adapted for extending at least partly within the plasma chamber of the ion source;
    a focusing element coupled to said probe for generating a selected field within the probe; and
    a filter coupled to said probe for filtering said ion passing through said probe and extracted from said plasma chamber.

11. The probe assembly of claim 10, wherein said probe body comprises a passageway sized and dimensioned for allowing the ion to pass therethrough, said body having a conical end portion that extends within the plasma chamber.

12. The probe assembly of claim 10, wherein a set of electrodes is coupled to said probe body for creating a field therein.

13. The probe assembly of claim 12, wherein said electrodes comprise a quadrupole focusing element for generating a field within the probe body for said ion from said plasma chamber.

14. The probe assembly of claim 10, wherein said filter comprises an EXB filter.

* * * * *